(12) United States Patent
Lee et al.

(10) Patent No.: US 8,486,280 B2
(45) Date of Patent: Jul. 16, 2013

(54) METHOD OF FORMING NANOSTRUCTURED SURFACE ON POLYMER ELECTROLYTE MEMBRANE OF MEMBRANE ELECTRODE ASSEMBLY FOR FUEL CELL

(75) Inventors: Kwang Ryeol Lee, Seoul (KR); Myoung Woon Moon, Seoul (KR); Sae Hoon Kim, Gyeonggi-do (KR); Byung Ki Ahn, Gyeongg-do (KR)

(73) Assignees: Hyundai Motor Company, Seoul (KR); Kia Motors Corporation, Seoul (KR); Korea Institute of Science and Technology, Seoul (KR)

( * ) Notice: Subject to any disclaimer, the term of this patent is extended or adjusted under 35 U.S.C. 154(b) by 474 days.

(21) Appl. No.: 12/475,651

(22) Filed: Jun. 1, 2009

(65) Prior Publication Data

US 2010/0102026 A1 Apr. 29, 2010

(30) Foreign Application Priority Data

Oct. 29, 2008 (KR) .................. 10-2008-0106450

(51) Int. Cl.
*H01M 8/02* (2006.01)
*H01M 8/00* (2006.01)

(52) U.S. Cl.
USPC ............. 216/11; 216/56; 216/58; 216/63; 216/67; 429/479; 429/482; 429/483; 429/492; 429/494; 429/516

(58) Field of Classification Search
USPC ............. 216/11, 56, 58, 63, 67; 429/492, 429/479, 482, 483, 494, 516
See application file for complete search history.

(56) References Cited

U.S. PATENT DOCUMENTS

| | | | | |
|---|---|---|---|---|
| 4,064,030 A | * | 12/1977 | Nakai et al. | 204/192.36 |
| 4,199,650 A | * | 4/1980 | Mirtich et al. | 428/421 |
| 5,628,869 A | * | 5/1997 | Mallon | 438/694 |
| 2007/0035053 A1 | * | 2/2007 | Schulz et al. | 264/2.5 |
| 2007/0184257 A1 | * | 8/2007 | Glocker et al. | 428/304.4 |
| 2007/0287051 A1 | * | 12/2007 | Onuma et al. | 429/33 |
| 2008/0296260 A1 | * | 12/2008 | Tserepi et al. | 216/67 |
| 2011/0165382 A1 | * | 7/2011 | Gogolides et al. | 428/156 |

FOREIGN PATENT DOCUMENTS

| | | | | |
|---|---|---|---|---|
| JP | 64-9683 A | * | 1/1989 | |
| JP | 01009683 A | * | 1/1989 | |
| JP | 08-148176 A | * | 6/1996 | |
| JP | 08148176 A | * | 6/1996 | |

(Continued)

OTHER PUBLICATIONS

Vourdas et al., Nanotechnology, vol. 18, article 125304, (2007).*

(Continued)

*Primary Examiner* — Lan Vinh
*Assistant Examiner* — David Kaufman
(74) *Attorney, Agent, or Firm* — Edwards Wildman Palmer LLP; Peter F. Corless

(57) ABSTRACT

The present invention provides a method of forming a nanostructured surface (NSS) on a polymer electrolyte membrane (PEM) of a membrane electrode assembly (MEA) for a fuel cell, in which a nanostructured surface is suitably formed on a polymer electrolyte membrane by plasma treatment during plasma assisted etching in a plasma-assisted chemical vapor deposition (PACVD) chamber, where catalyst particles or a catalyst layer are directly deposited on the surface of the polymer electrolyte membrane having the nanostructured surface.

10 Claims, 11 Drawing Sheets

FOREIGN PATENT DOCUMENTS

| | | |
|---|---|---|
| JP | 2005-194184 | 7/2005 |
| JP | 2005-294109 | 10/2005 |
| JP | 2007-257886 | 10/2007 |
| KR | 10-2007-0035712 | 4/2007 |
| KR | 10-2007-0095055 | 9/2007 |

OTHER PUBLICATIONS

Vourdas et al., Nanotechnology, vol. 18, p. 125304 (2007).*
Vourdas et al., Nanotechnology 18, 125304, (2007).*

* cited by examiner

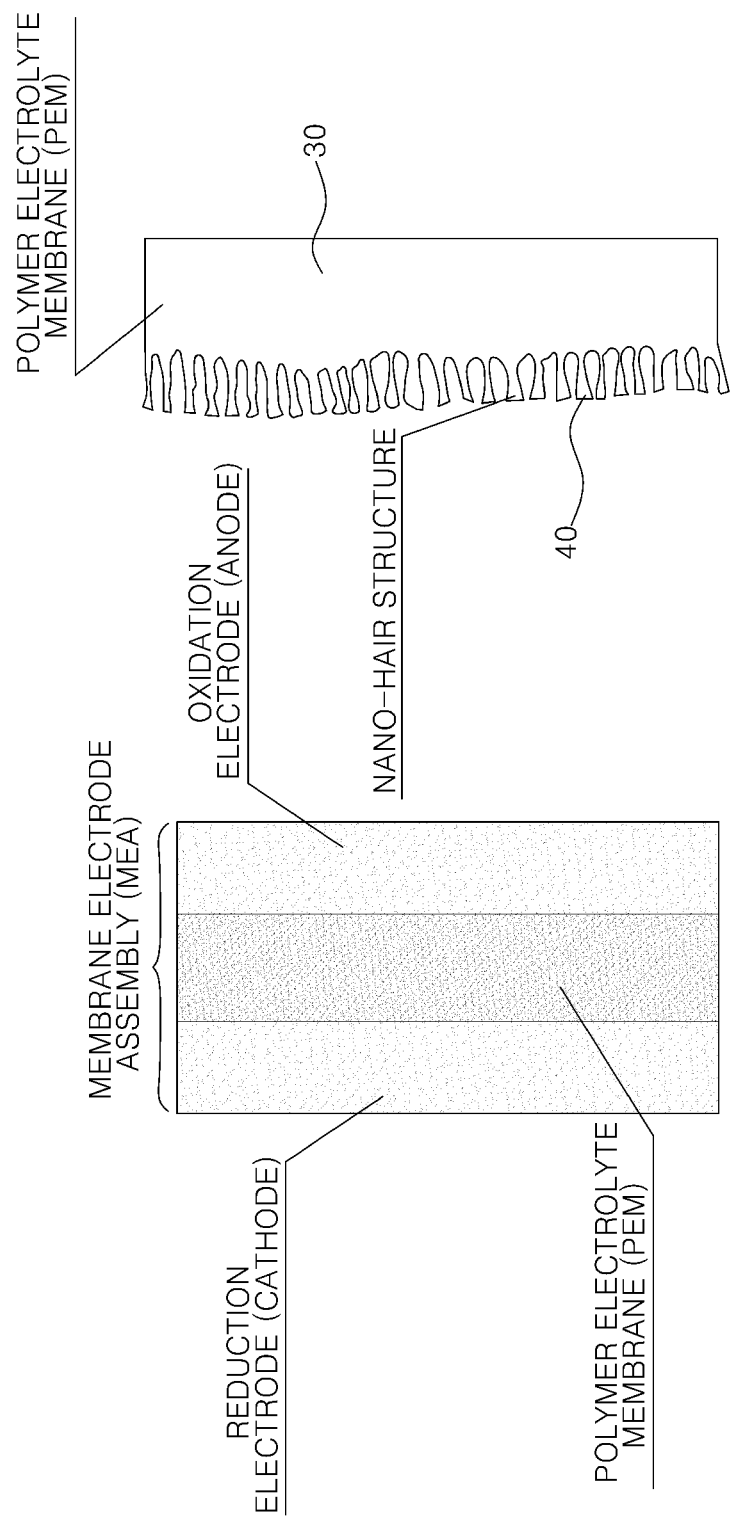

O₂ TREATMENT

CF$_4$ TREATMENT

NANOHOLE STRUCTURES

WETTING BEHAVIOR BEFORE PLASMA TREATMENT

WETTING BEHAVIOR AFTER PLASMA TREATMENT

METHOD OF FORMING NANOSTRUCTURED SURFACE ON POLYMER ELECTROLYTE MEMBRANE OF MEMBRANE ELECTRODE ASSEMBLY FOR FUEL CELL

CROSS-REFERENCE TO RELATED APPLICATION

This application claims under 35 U.S.C. §119(a) the benefit of Korean Patent Application No. 10-2008-0106450 filed Oct. 29, 2008, the entire contents of which are incorporated herein by reference.

BACKGROUND (a) Technical Field

The present disclosure relates to a method of forming a nanostructured surface (NSS) on a polymer electrolyte membrane (PEM). IN preferred aspects, it relates to a method of forming a nanostructured surface (NSS) on a polymer electrolyte membrane (PEM) of a membrane electrode assembly (MEA) for a fuel cell, in which a nanostructured surface such as nano-hair structures is formed on a polymer electrolyte membrane by plasma treatment with gases, for example, argon, oxygen, $CF_4$, by plasma-assisted chemical vapor deposition (PACVD), where catalyst particles or a catalyst layer is directly deposited on the surface of the polymer electrolyte membrane having the nanostructures, for example Inano-hairs or nano-holes, by sputtering, thus suitably fabricating a membrane electrode assembly for a fuel cell by a simple process and considerably reducing the amount of catalyst needed in the method.

(b) Background Art

Polymer electrolyte membrane fuel cells (PEMFC) that are presently used have many advantages, including low operation temperature and high energy efficiency, when compared to other types of fuel cells. Accordingly, extensive research aimed at utilizing the PEMFC as a power source for vehicles has been carried out.

In the PEMFC, the current density is high, the operation temperature may be as low as 60 to 80° C., and the possibility of corrosion and the electrolyte loss are considerably low, for example when compared to a phosphoric acid fuel cell (PAFC), a molten carbonate fuel cell (MCFC), or a solid oxide fuel cell (SOFC).

Further, because a PEMFC can be produced at low cost, with a low volume, has a long stack life, and fast start-up, is suitable for discontinuous operation, and is able to stably supply power, a PEMFC has various applications, such as in vehicles.

Each of the unit cells constituting the fuel cell preferably includes a polymer electrolyte membrane (or a proton exchange membrane), and an oxidation electrode (anode) and a reduction electrode (cathode) that are suitably integrally formed on both sides of the polymer electrolyte membrane by a hot press, thus forming a membrane electrode assembly (MEA) 10.

Preferably, since the anode and the cathode are integrally formed on the surface of the polymer electrolyte membrane, a reaction [$H_2 \rightarrow 2H + 2e^+$] takes place at the anode, on which carbon black as a catalyst support, and where water and protons can be bonded, is suitably coated.

At the cathode, a reaction [$\frac{1}{2}O_2 + 2H + 2e^+ \rightarrow H2O$] takes place, and protons are transported through the MEA by the above reaction, thus generating electricity and water.

Preferably, a polyperfluorosulfonate polymer electrolyte membrane having high hydrogen ion conductivity is used for the polymer electrolyte membrane of the fuel cell, and, mor preferably, a Nafion membrane manufactured by Dupont is more widely used, since the surface has hydrophobic properties and is structurally stable.

As research related to the polymer electrolyte membranes for fuel cells has progressed, the stability of the fuel cell and its manufacturing cost have become objects of research, as the properties of the polymer electrolyte membrane and the amount of used catalyst are closely related to the performance of the fuel cell and its manufacturing cost.

Accordingly, as one of the conventional methods for improving the performance of the MEA and reducing the amount of catalyst loadings, a method of forming a whisker structure on a silicon substrate and attaching it to the surface of the polymer electrolyte membrane using an adhesive has been proposed. Using this method, it is possible to considerably reduce the amount of catalyst loadings due to an increased surface area when platinum catalyst is deposited on the surface of the electrolyte membrane, as compared to the conventional methods.

Further, attempts to improve the performance of the polymer electrolyte membrane by directly modifying the surface of the polymer electrolyte membrane using various methods such as plasma, ion beam, or electron beam, have been made, and efforts to increase the contact area between the polymer electrolyte membrane and catalyst have continued to progress. Moreover, it has been reported that, if the surface area is increased, the amount of expensive catalyst can be reduced and, further, the efficiency can be considerably improved [M. Prassanna, E. A. Cho. H. J. Kim, T. H. Kim, et al., J. Power Sources (2006): Korean Patent No. 0405671 (2002) to Ki Chun Lee at al., both incorporated by reference in their entireties herein].

A method of increasing surface roughness using ion beams has been recently employed, and a method of coating platinum catalyst-supported carbon black on the thus surface-modified polymer electrolyte membrane by spray coating has also been used. In a study aimed at utilizing low pressure and high density argon (Ar) plasma [D. Ramdutt et al, Journal of Power Sources 165 (2007) 41-48, incorporated by reference in its entirety herein], a polymer electrolyte membrane was exposed to argon plasma at a power of 50 W for 5 to 120 seconds; however, the surface had hydrophilic properties and the shape of the surface was little changed, which resulted in a deterioration of proton conductivity.

Accordingly, a study on surface treatment conditions, which provides a method to increase surface area due to a change in surface shape of the membrane electrode assembly and, at the same time, to increase in hydrophobic nature of the surface, is needed.

Research aimed at supporting platinum (Pt) as a catalyst for delivering protons on the surface of a polymer electrolyte membrane, i.e., an ion exchange membrane, has been carried out. Further, in order to reduce the amount of platinum loading, a method of supporting platinum particles on carbon black and fabricating an ion exchange membrane by spray coating, screen printing, or tape casting has been proposed.

Dual ion-beam assisted deposition and sputter deposition, in which the surface of a polymer electrolyte membrane is suitably modified and then platinum is directly deposited on the surface of the membrane by sputtering, and electrodeposition, electrospray, etc. have been proposed [J. H. Wee, K. Y. Lee. S. H. Kim, Journal of Power Sources 165 (2007) 667-677, incorporated by reference in its entirety herein].

The above information disclosed in this Background section is only for enhancement of understanding of the background of the invention and therefore it may contain information that does not form the prior art that is already known in this country to a person of ordinary skill in the art.

SUMMARY OF THE DISCLOSURE

In one aspect, the present invention provides a method of forming a nanostructured surface (NSS) on a polymer electrolyte membrane (PEM) of a membrane electrode assembly (MEA) for a fuel cell, in which nano-sized surface patterns are suitably formed on a polymer electrolyte membrane by plasma-assisted chemical vapor deposition (PACVD) and then platinum catalyst is directly deposited on the surface of the polymer electrolyte membrane having the nanostructured surface by sputtering, thus fabricating a membrane electrode assembly for a fuel cell by a suitably simple process and considerably reducing the amount of catalyst, compared to existing methods.

In one aspect, the present invention provides a method of suitably forming a nanostructured surface on a polymer electrolyte membrane of a membrane electrode assembly for a fuel cell, the method preferably comprising: forming a plurality of nanostructures on a surface of a polymer electrolyte membrane by performing plasma assisted etching on the surface of the polymer electrolyte membrane placed in a plasma assisted chemical vapor deposition (PACVD) chamber, maintained at a pressure of $1.0 \times 10^{-7}$ to $2.75 \times 10^{-3}$ Pa, at a bias voltage of −100 to −50 kV for 1 second to 60 minutes during the plasma assisted etching in the PACVD chamber; and supporting or depositing the catalyst on the surface of the polymer electrolyte membrane having the plurality of nanostructures formed by the plasma treatment.

In a preferred embodiment, the nanostructure is suitably formed into a nano-hair structure having a width of 1 to 1,000 nanometers and a length of 1 to 10,000 nanometers.

In another preferred embodiment, the nanostructure is suitably formed into a nanohole structure.

In still another preferred embodiment, the nanostructure is suitably formed by ion beam or etching methods in addition to the PACVD.

In yet another preferred embodiment, the nanostructure is suitably formed by using a gas for plasma treatment selected from the group consisting of, but not limited to, argon, $CF_4$, oxygen, $N_2$, and $H_2$.

In still yet another preferred embodiment, the method further comprises the step of forming a plurality of convex or concave nanostructures on the surface of the polymer electrolyte membrane by a method preferably selected from the group consisting of, but not limited to, ion beam, reactive ion etching (RIE), and sputtering in addition to the PACVD.

In a further preferred embodiment, the method further comprises the step of changing an angle formed between the plasma flow direction and the surface of the polymer electrolyte membrane, thus forming a plurality of nanostructures suitably inclined at a specific angle in one direction on the surface of the polymer electrolyte membrane.

In another further preferred embodiment, the step of supporting or depositing catalyst on the surface of the polymer electrolyte membrane having the plurality of nanostructures is preferably performed by a method selected from the group consisting of, but not limited to, spray coating, in which platinum or platinum catalyst particles are suitably supported on carbon black and then formed on an ion exchange membrane, screen coating, tape casting, dual ion-beam assisted deposition and sputter deposition, in which a surface of a polymer electrolyte membrane is suitably modified and then platinum or a platinum alloy is directly deposited on the surface of the polymer electrolyte membrane by sputtering, electrodeposition, electrospray, supercritical deposition using carbon aerogel, platinum sol, and a method of supporting platinum or a platinum alloy using carbon nanotubes, amorphous supermicroporous carbons, or carbon aerogel supports.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum).

As referred to herein, a hybrid vehicle is a vehicle that has two or more sources of power, for example both gasoline-powered and electric-powered.

The above features and advantages of the present invention will be apparent from or are set forth in more detail in the accompanying drawings, which are incorporated in and form a part of this specification, and the following Detailed Description, which together serve to explain by way of example the principles of the present invention. The above and other features of the invention are discussed infra.

BRIEF DESCRIPTION OF THE DRAWINGS

The above and other features of the present invention will now be described in detail with reference to certain exemplary embodiments thereof illustrated with the accompanying drawings which are given hereinbelow by way of illustration only, and thus are not limitative of the present invention, and wherein:

FIG. 1B is a diagram illustrating a structure of a membrane electrode assembly for a fuel cell and a state in which nano-hair structures are formed on the surface of a polymer electrolyte membrane in accordance with the present invention;

Figure 1A:
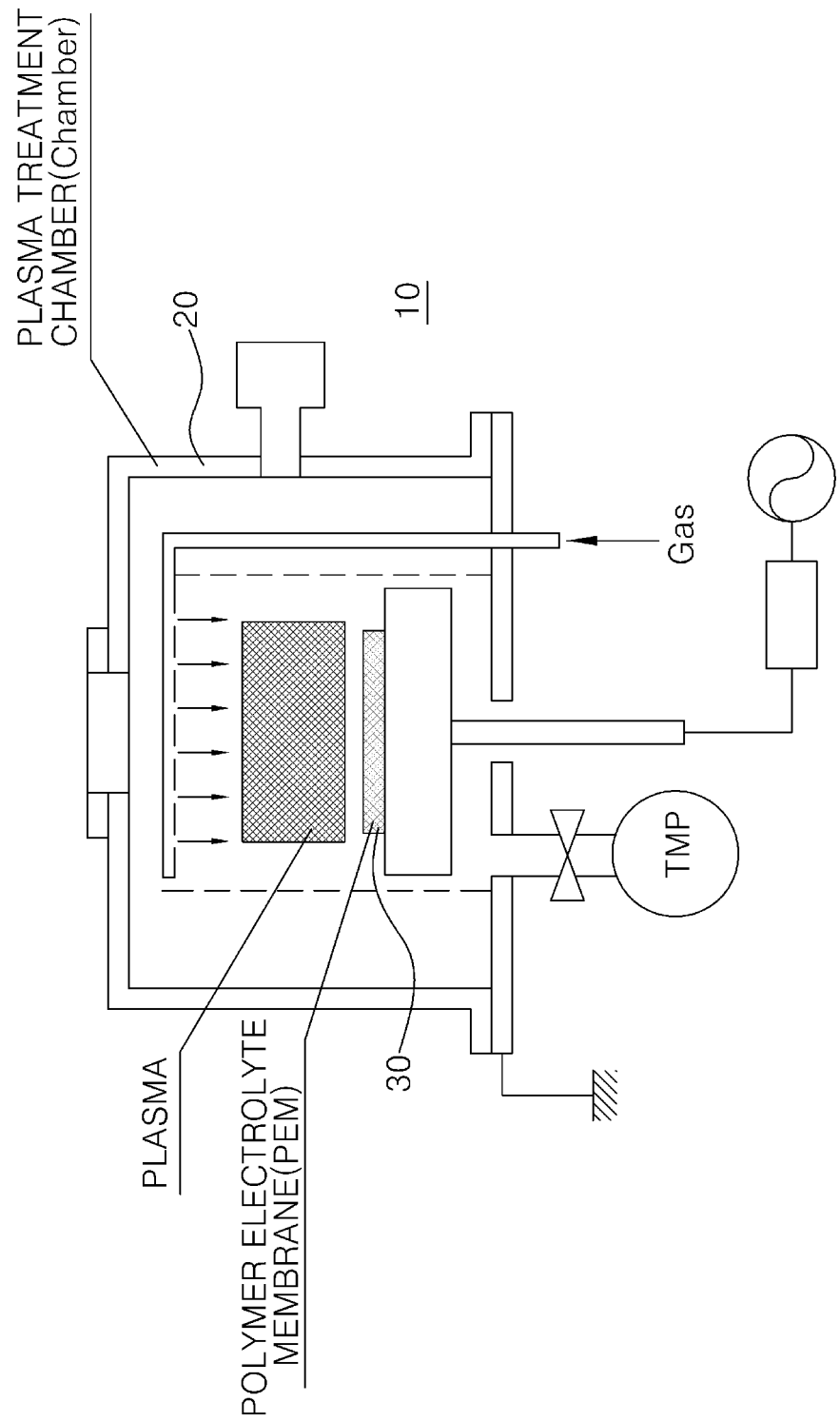
FIG. 1A is a schematic diagram of a plasma treatment apparatus for forming a nanostructured surface on a polymer electrolyte membrane in accordance with the present invention.

Reference numerals set forth in the Drawings include reference to the following elements as further discussed below:

10: plasma treatment apparatus
20: chamber
30: polymer electrolyte membrane
40: nanostructure It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

As described herein, the present invention includes a method of forming a nanostructured surface on a polymer electrolyte membrane of a membrane electrode assembly for a fuel cell, the method comprising forming a plurality of nanostructures on a surface of a polymer electrolyte membrane by performing plasma treatment on the surface of the polymer electrolyte membrane placed in a plasma treatment chamber, and supporting or depositing catalyst on the surface of the polymer electrolyte membrane having the plurality of nanostructures formed by the plasma treatment.

In one embodiment, the plasma treatment chamber is maintained at a pressure of $1.0 \times 10^{-7}$ to $2.75 \times 10^{-3}$ Pa, at a bias voltage of $-100V$ to $-5 kV$ for 1 second to 60 minutes during the plasma assisted etching in a plasma-assisted chemical vapor deposition (PACVD) chamber.

In another embodiment, the nanostructure is formed into a nano-hair structure having a width of 1 to 1,000 nanometers and a length of 1 to 10,000 nanometers.

In still another further embodiment, the nanostructure is formed into a nanohole structure.

In another embodiment, the nanostructure is formed by ion beam or etching methods in addition to the PACVD.

In another embodiment, the nanostructure is formed by using a gas for plasma treatment selected from the group consisting of, but not limited to, argon, $CF_4$, oxygen, $N_2$, and $H_2$.

In other preferred embodiments, the method further comprises forming a plurality of convex or concave nanostructures on the surface of the polymer electrolyte membrane by a method selected from the group consisting of, but not limited to, ion beam, reactive ion etching (RIE), and sputtering, in addition to the PACVD.

In other embodiments, the method further comprises changing an angle formed between the plasma flow direction and the surface of the polymer electrolyte membrane, thus forming a plurality of nanostructures inclined at a specific angle in one direction on the surface of the polymer electrolyte membrane.

In related embodiments, supporting or depositing catalyst on the surface of the polymer electrolyte membrane having the plurality of nanostructures is performed by a method selected from the group consisting of, but not limited to, spray coating, in which platinum or platinum catalyst particles are supported on carbon black and then formed on an ion exchange membrane, screen coating, tape casting, dual ion-beam assisted deposition and sputter deposition, in which a surface of a polymer electrolyte membrane is modified and then platinum or a platinum alloy is directly deposited on the surface of the polymer electrolyte membrane by sputtering, electrodeposition, electrospray, supercritical deposition using carbon aerogel, platinum sol, and a method of supporting platinum or a platinum alloy using carbon nanotubes, amorphous supermicroporous carbons, or carbon aerogel supports.

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

In preferred embodiments, the present invention provides a polymer electrolyte membrane, on which nano-sized structures (nanostructures) such as hair patterns having an aspect ratio of 1:50 (width:height) are formed during the plasma assisted etching in a plasma-assisted chemical vapor deposition (PACVD) chamber, the polymer electrolyte membrane having a hydrophobic surface with respect to pure water. Moreover, in further preferred embodiments the present invention is directed to methods that suitably simplify the fabricating process and reduce the amount of used platinum by directly depositing a platinum (Pt) catalyst layer on the polymer electrolyte membrane having a nanostructured surface, thus achieving a considerable reduction in cost.

A method of fabricating a polymer electrolyte membrane having a nanostructured surface, a method of depositing catalyst particles or a catalyst layer in a nano-size on the thus fabricated nanostructured surface, and an evaluation of wetting behavior on the nanostructured surface will be described in more detail with reference to the following examples.

EXAMPLES

The following examples illustrate preferred embodiments of the present invention and are not intended to limit the same.

(1) Plasma Surface Treatment

Plasma was formed using argon, oxygen, and $CF_4$ gases as a precursor at 13.56 MH$_z$ during the plasma assisted etching in a plasma-assisted chemical vapor deposition (PACVD) chamber, and a polyperfluorosulfonate polymer electrolyte membrane was preferably used as a substrate.

In exemplary embodiments, and as shown in FIG. 1A, the substrate, i.e., the polyperfluorosulfonate polymer electrolyte membrane 30, was preferably placed on an electrode (R.F powered, water-cooled cathode) in a chamber 20 of a plasma treatment apparatus 10 so that plasma was suitably applied to the substrate through an impedance matching circuit.

Preferably, the plasma surface treatment was suitably performed at a pressure of 0.49 Pa and a bias voltage of −100V to −50 kV for 1 second to 60 minutes using the gases (argon, oxygen, and $CF_4$) on the polymer electrolyte membrane 30.

(2) Catalyst Deposition

In further exemplary embodiments, platinum catalyst was suitably deposited on the plasma surface-treated polymer electrolyte membrane, i.e., the polymer electrolyte membrane having nano-hair structures, preferably formed by a simple sputtering method and, after the deposition, the polymer electrolyte membrane having nano-hair structures was taken out of the chamber 20 and preferably maintained at a temperature of 20 to 25° C. and a humidity of 60 to 70%.

According to further preferred embodiments of the present invention, the catalyst may be suitably deposited or supported on the polymer electrolyte membrane by a method selected from the group consisting of, but not limited to, spray coating, in which platinum or platinum catalyst particles are suitably supported on carbon black and then formed on an ion exchange membrane, screen coating, tape casting, dual ion-beam assisted deposition and sputter deposition, in which the surface of a polymer electrolyte membrane is suitably modified and then platinum or a platinum alloy is directly deposited on the surface of the membrane by sputtering, electrodeposition, electrospray, supercritical deposition using carbon aerogel, platinum sol, and a method of supporting platinum or a platinum alloy using carbon nanotubes, amorphous supermicroporous carbons, or carbon aerogel supports.

(3) Surface Analysis

According to further preferred embodiments of the invention, the surfaces of the polymer electrolyte membrane before and after the plasma treatment and the catalyst deposition were observed using a scanning electron microscopy (SEM).

In further preferred embodiments, the contact angles before and after the surface modification of the polymer electrolyte membrane were preferably measured with distilled water using an NRL contact angle goniometer for suitably measuring wetting angle.

Preferably, a water droplet was gently placed onto the surfaces of the polymer electrolyte membranes, of which base lines were facing each other, the contact angles were suitably measured using the NRL contact angle goniometer for measuring wetting angle, and the wetting angles were suitably photographed, preferably using a GBX goniometer.

(4) Surface Analysis Results

According to further exemplary embodiments, and as shown in the right diagram of FIG. 1B, it can be observed that nanostructures 40 such as hair patterns or wools were suitably formed on the polyperfluorosulfonate polymer electrolyte membrane 30 after the plasma surface treatment by plasma-assisted chemical vapor deposition (PACVD).

The analysis results are described in more detail with reference to the accompanying drawings below.

Figure 2:
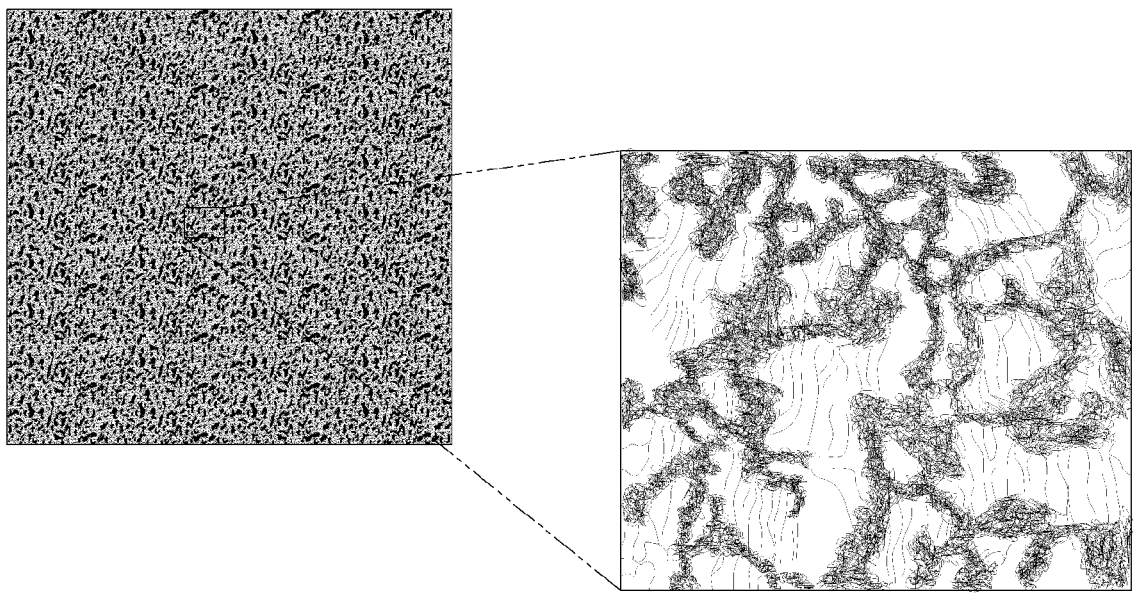
FIG. 2 is a scanning electron micrograph (SEM) image taken after performing surface treatment on a polymer electrolyte membrane using argon plasma at a bias voltage of −800 V for 3 minutes and sputtering Pt catalyst.

As shown in the SEM image of FIG. 2, in certain exemplary embodiments, it can be observed that bundles of nanostructures (also called nano-hair patterns, nanofibers, nanowools, etc.) having a width of 10 to 30 nanometers and a length of 0.2 to 2 micrometers are suitably distributed on the surface of the polymer electrolyte membrane, which has been preferably exposed to an argon gas plasma at a bias voltage of −800 V for 3 minutes.

According to further exemplary embodiments, it can be seen that a round structure having a diameter of about 100 nanometers is suitably formed at the tip of each of the nanostructures.

Further, it can be also seen that a platinum catalyst layer having a thickness of several nanometers surrounds the nanostructures, the platinum catalyst layer being suitably formed by depositing platinum catalyst on the nanostructures by sputtering.

Figure 3A:
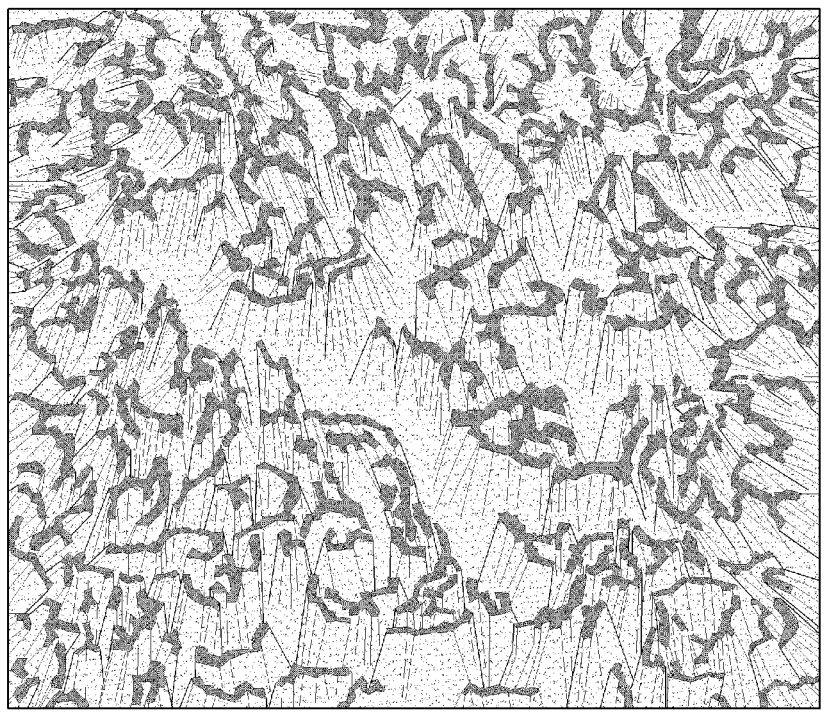
FIG. 3A is a SEM image taken after sputtering Pt catalyst on the surface of a polymer electrolyte membrane by argon plasma treatment at a bias voltage of −600 V for 3 minutes.

According to other preferred embodiments, as shown in the SEM image of FIG. 3A taken after sputtering Pt catalyst on the surface of the polymer electrolyte membrane by argon plasma treatment at a bias voltage of −600 V (relatively low plasma energy) for 3 minutes, it can be observed that, while the width of the nanostructures is kept suitably constant at 20 to 30 nanometers, the length thereof is 300 to 600 nanometers, which is reduced compared to that of FIG. 2.

Figure 3B:
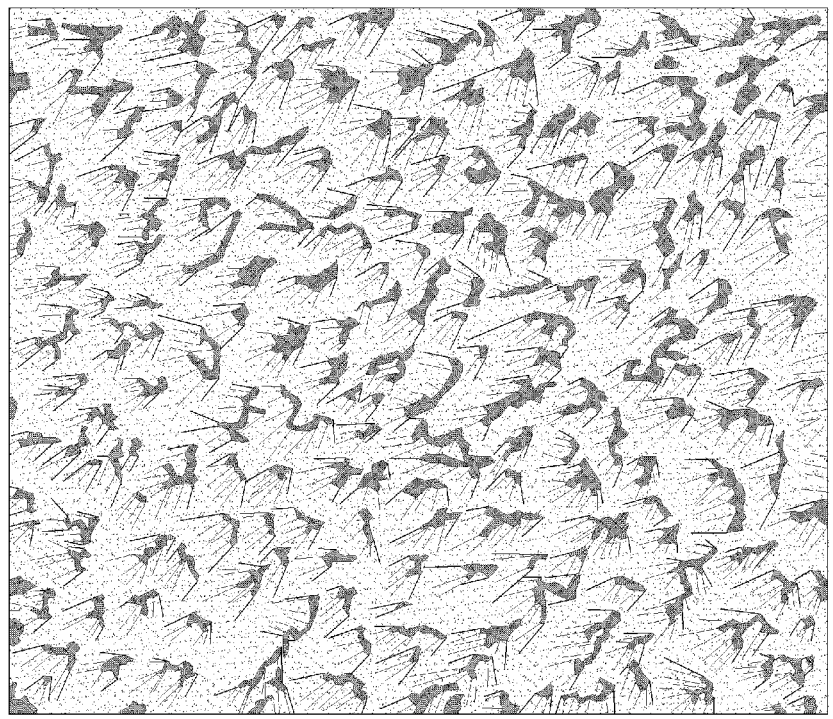
FIG. 3B is a SEM image taken after sputtering Pt catalyst on the surface of a polymer electrolyte membrane by argon plasma treatment at a bias voltage of −800 V for 10 minutes.

In still other embodiments, for example as shown in the SEM of FIG. 3B, taken after sputtering Pt catalyst on the surface of the polymer electrolyte membrane by argon plasma treatment at a bias voltage of −800 V (relatively high plasma energy) for 10 minutes, it can be observed that the bundles of nanostructures are more clearly formed and their tips are densely crowded compared to the bottoms, thus suitably forming a conical shape.

Figure 4A:
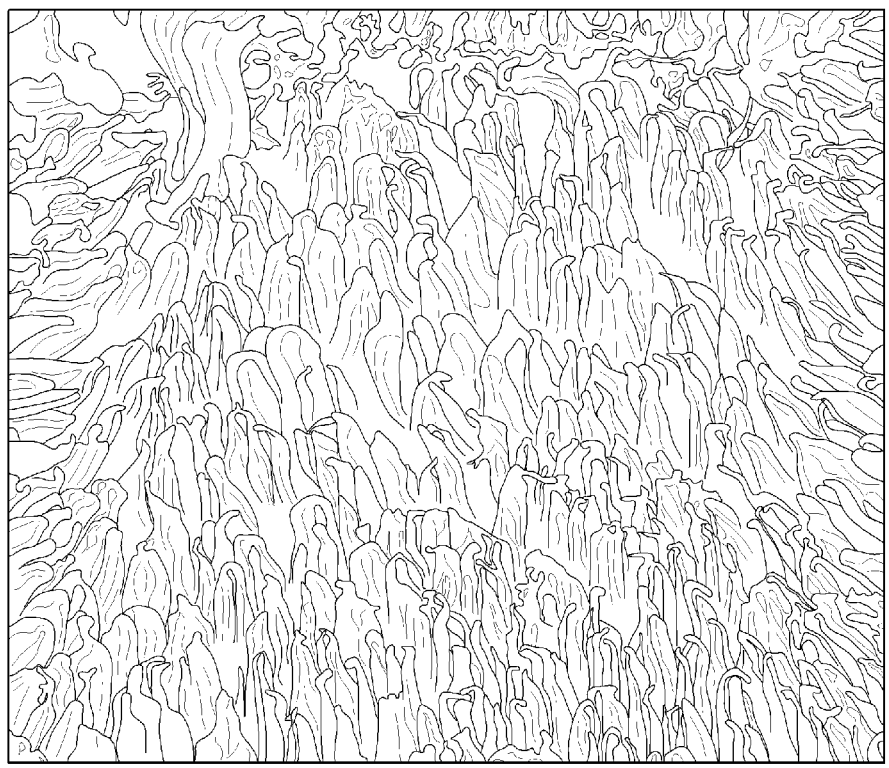
FIG. 4A is a SEM image of the surface structure of a polymer electrolyte membrane after oxygen plasma treatment.
Figure 4B:
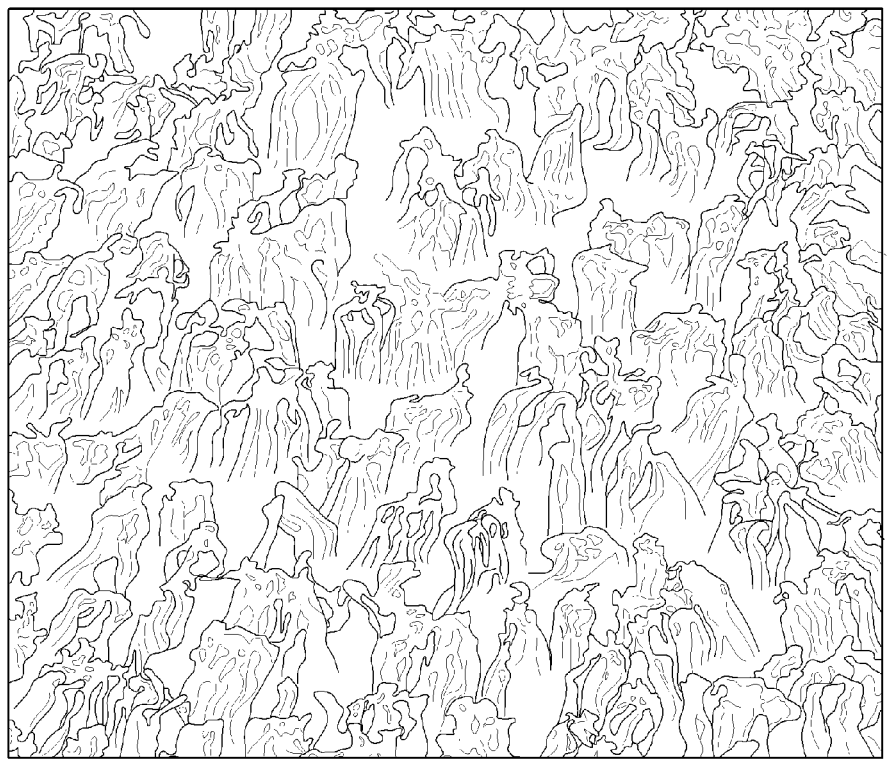
FIG. 4B is a SEM image of the surface structure of a polymer electrolyte membrane after $CF_4$ plasma treatment, taken after sputtering Pt catalyst.

When compared to the results using the argon plasma as above, in certain preferred embodiments of the invention as herein described, the nanostructures suitably formed after oxygen plasma treatment at a bias voltage of −400 V for 60 minutes as shown in FIG. 4A and the nanostructures formed after $CF_4$ plasma treatment at a bias voltage of −925 V for 3 minutes as shown in FIG. 4B have the following features.

Accordingly, while the nanostructures suitably formed by the oxygen plasma treatment have substantially the same width and height as the nanostructures suitably formed by the argon plasma treatment, a larger amount of etched regions (corresponding to black regions of FIG. 4B) is observed in the nanostructures suitably formed by the $CF_4$ plasma treatment than in the nanostructures suitably formed by the oxygen plasma treatment or the argon plasma treatment.

Further, in related embodiments, since a thin carbon coating layer is preferably formed on the nanostructures and the membrane surface in the case of the $CF_4$ plasma treatment as shown in the existing studies, it can be expected that the carbon layer is suitably distributed on the surface of the polymer electrolyte membrane.

Figure 5:
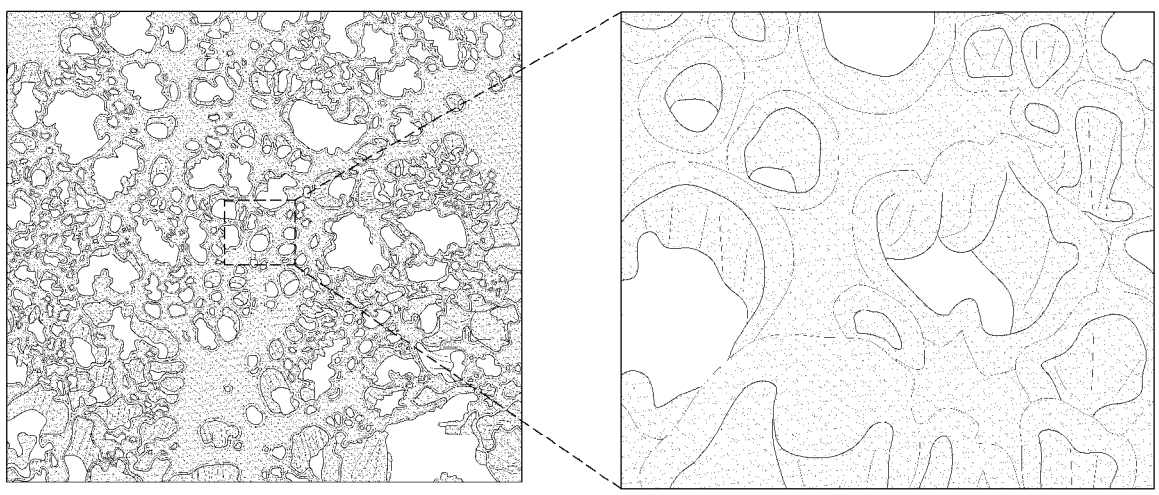
FIG. 5 is a SEM image showing nanohole structures formed on the surface of a polymer electrolyte membrane by argon plasma treatment at a bias voltage of −800 V for 1 minute, taken after depositing Pt catalyst on the surface of nanohole structures by sputtering.

According to further preferred embodiments of the invention and as shown in FIG. 5, FIG. 5 is a SEM image showing nanohole structures suitably formed on the surface of the polymer electrolyte membrane by argon plasma treatment at a voltage of −800 V for 1 minute, taken after depositing Pt catalyst on the surface of nanohole structures preferably by sputtering.

As shown in FIG. 5, the nanohole structures are suitably formed on the surface of the polymer electrolyte membrane, instead of the nanostructures (also called nano-hair patterns, nanofibers, nanowool, etc.). In preferred embodiments, the nanohole structures may be suitably obtained when performing argon plasma treatment at energy of −800 eV for 1 minute, and it can be seen that it is possible to suitably control the conditions for forming such concave structures, which are contrary to the convex nanostructures as shown in FIGS. 2 to 4.

In certain preferred embodiments, the nanohole structures are formed when polymer chains of the polymer electrolyte membrane are preferably etched from locally unstable regions during the argon plasma treatment at energy of −800 V for 1 minute and thus the concave nanohole structures are first formed. Accordingly, in further embodiments, the area of the nanoholes is gradually increased as the plasma treatment time increases and, at the same time, the nanoholes are suitably formed into the convex nanostructures (also called, for example, but not limited to, nano-hair patterns, nanofibers, nanowool, etc.) for example as shown in FIGS. 2 to 4 at the regions where the nanoholes meet each other.

Figure 6A:
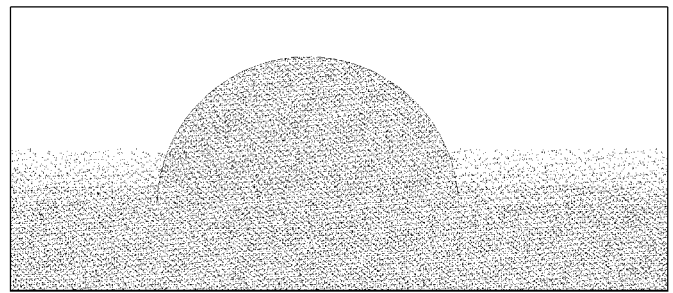
FIG. 6A is an optical image showing wetting behavior of a pure water droplet on the surface of a polymer electrolyte membrane before argon plasma surface treatment.
Figure 6B:
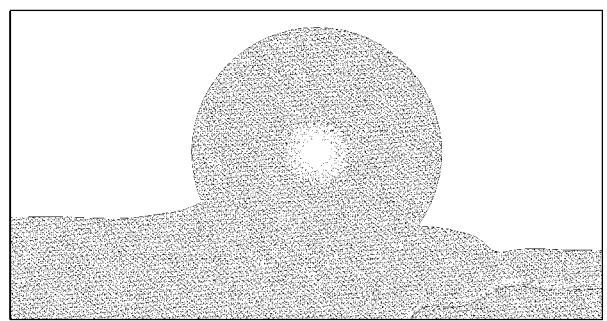
FIG. 6B an optical image showing wetting behavior of a pure water droplet on the surface of a polymer electrolyte membrane after argon plasma surface treatment.

FIGS. 6A and 6B illustrate further exemplary embodiments of the invention, and show the test results of the wetness of the polymer electrolyte membrane in accordance with preferred embodiments of the present invention.

For example, FIG. 6A is an optical image showing wetting behavior of a pure water droplet on the surface of a polymer electrolyte membrane before argon plasma surface treatment, and FIG. 6B an optical image showing wetting behavior of a pure water droplet on the surface of a polymer electrolyte membrane after the argon plasma surface treatment.

Preferably, the wetting angle is changed from about 80° before the argon plasma treatment as shown in FIG. 6A to about 130° after the argon plasma treatment, for example as shown in FIG. 6B, which shows that in certain preferred embodiments the hydrophilic surface before the plasma treatment is suitably changed into the hydrophobic surface after the plasma treatment. Accordingly, it can be seen that the hydrophobic properties are suitably increased by the nanostructures (also called nano-hair patterns, nanofibers, nanowool, etc.) suitably formed on the surface of the polymer electrolyte membrane in accordance with certain preferred embodiments of the present invention.

Figure 7:
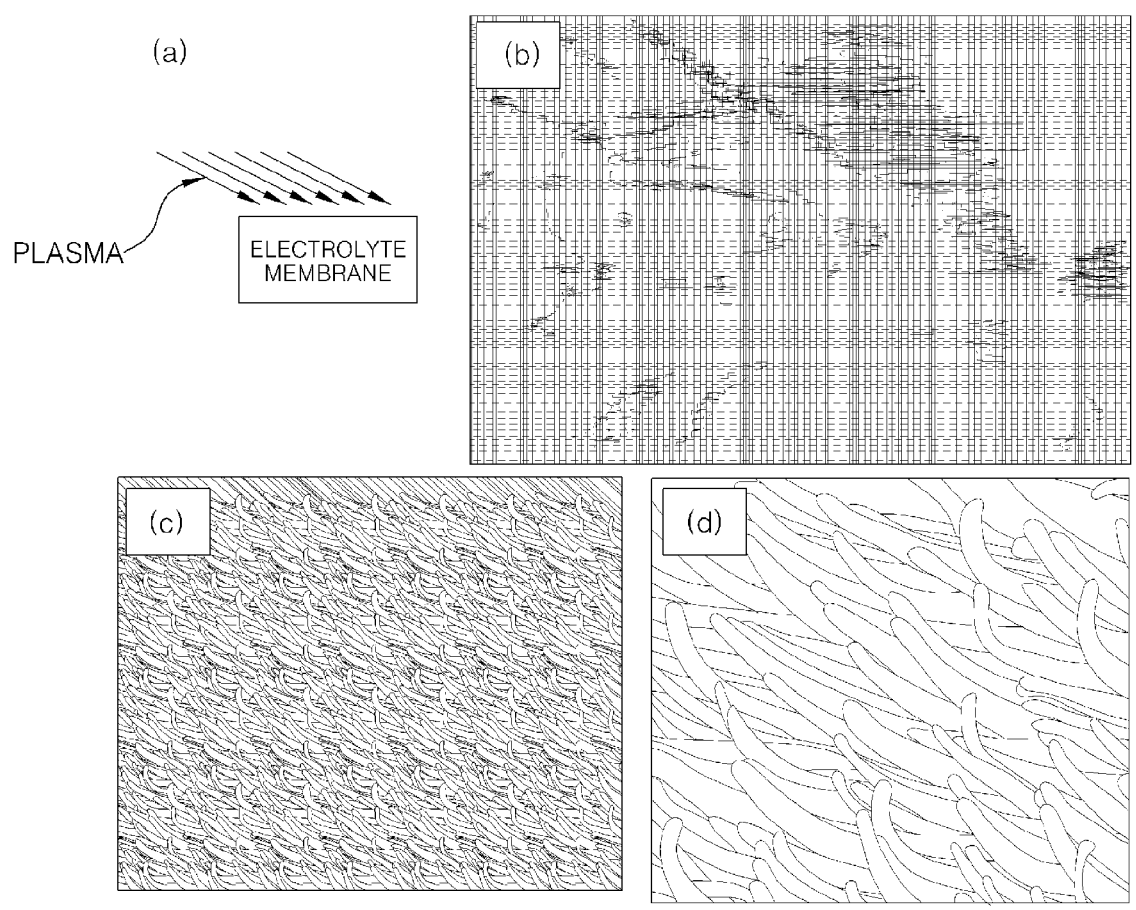
FIG. 7A is a schematic diagram illustrating argon plasma treatment performed on the surface of a polymer electrolyte membrane at an oblique angle of 55°.
FIG. 7B is a SEM image of an inclined nanostructured surface formed on a polymer electrolyte membrane.
FIG. 7C is an enlarged image of a red rectangular box of FIG. 7B.
FIG. 7D is an enlarged image of a portion of FIG. 7C.

Further, in other preferred embodiments, it can be seen from the images of test results, for example as shown in exemplary FIG. 7 that it is possible to suitably modify the structure of nanostructures formed on the surface of the polymer electrolyte membrane.

Exemplary FIG. 7A is a schematic diagram illustrating argon plasma treatment suitably performed on the surface of a polymer electrolyte membrane at an oblique angle of 55°, and FIGS. 7B to 7D are SEM images showing an inclined (or tilted) nanostructured surface suitably formed on the polymer electrolyte membrane.

Preferably, the wetting angle of the inclined nanostructured surface may be suitably changed according to the tilting direction of nano structured hair patterns. Preferably, since the wetting angle to the inclined direction is greater than that in the opposite direction, it is expected in certain embodiments of the invention that it is possible to suitably form nanostructures having characteristics in that water droplets easily move in the inclined direction, and it is thus possible to suitably control the discharge properties of water produced during an electrochemical reaction in a fuel cell.

Thus, in certain preferred embodiments of the invention as described herein, it is possible to suitably change the angle that the nanostructured surface forms by adjusting the angle formed between the argon plasma and the polymer electrolyte membrane. Since the nanostructured surface capable of changing its angle allows the water droplets to easily run in a specific direction, it can be used as a structure that allows water or water droplets on the surface of the polymer electrolyte membrane to move in a specific direction.

Accordingly, in certain embodiments of the present invention, it can be seen that the inclined nanostructures (also called nano-hair patterns, nanofibers, nanowool, etc.) are suitably formed on the surface of the polymer electrolyte membrane by preferably performing the plasma treatment having directionality by a bias voltage, and thus it is possible to structurally change the nanostructures formed on the surface of the polymer electrolyte membrane.

As described herein, it can be observed that convex nanostructures (also called nano-hair patterns, nanofibers, nanowool, etc.) or concave nanohole structures having a considerably increased surface area are formed on the surface of the polymer electrolyte membrane by plasma surface treatment of argon, oxygen, or $CF_4$ gas at a bias voltage of $-600$ to $-950$ V for 1 to 20 minutes in accordance with preferred embodiments of the present invention. Further, in preferred embodiments of the invention as described herein, the surface area is considerably increased by surface treatment of the polymer electrolyte membrane by a suitable method in accordance with the present invention and further the hydrophobic properties of the surface of the polymer electrolyte membrane are suitably increased. Furthermore, as described here, it is possible to form nano-hair structures, which preferably form an oblique angle in a specific direction, by obliquely irradiating plasma to the surface of the polymer electrolyte membrane.

According to preferred embodiments of the present invention as described herein, it is possible to suitably increase the surface area of the polymer electrolyte membrane and, at the same time, suitably increase the hydrophobic properties of the surface of the polymer electrolyte membrane by forming nano-sized structures (nanostructures) such as nano-hair or nanohole structures on the polyperfluorosulfonate polymer electrolyte membrane during plasma assisted etching in the plasma-assisted chemical vapor deposition (PACVD) chamber.

Moreover, it is possible to easily fabricate the membrane electrode assembly for a fuel cell by a simple process of directing coating platinum (Pt) catalyst on the nanostructured surface having increased surface area and hydrophobic properties by sputtering.

Accordingly, since the surface of the polymer electrolyte membrane in accordance with the present invention comprises the nanostructures such as nano-hair patterns, its surface area is suitably increased and, at the same time, the hydrophobic properties with respect to water are suitably increased. As a result, it is possible to considerably reduce the number of process of fabricating the membrane electrode assembly for a fuel cell and further reduce the amount of platinum catalyst.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A method of forming a nanostructured surface on a polymer electrolyte membrane of a membrane electrode assembly for a fuel cell, the method comprising:
    forming a plurality of nano hair structures on a surface of a polymer electrolyte membrane by performing plasma-assisted etching on the surface of the polymer electrolyte membrane placed in a plasma-assisted chemical vapor deposition (PACVD) chamber, maintained at a pressure of $1.0 \times 10^{-7}$ to $-2.75 \times 10^{-4}$ Pa, at a bias voltage of $-100$V to $-50$ kV for 1 second to 60 minutes during the plasma-assisted etching in the PACVD chamber; and
    supporting or depositing catalyst on the surface of the polymer electrolyte membrane having the plurality of nanostructures formed by the plasma treatment,
    wherein the nanostructures are nano-hair structures having a width of 1 to 1,000 namometers and a length of 1 to 10.000 nanometers, wherein the nano-hair structures have aspect ratio of 1:50 (width:height).

2. The method of claim 1, wherein the nanostructure is formed by using a gas for plasma treatment selected from the group consisting of argon, $CF_4$, oxygen, $N_2$, and $H_2$.

3. The method of claim 1, further comprising changing an angle formed between the plasma flow direction and the surface of the polymer electrolyte membrane, thus forming a plurality of nanostructures inclined at a specific angle in one direction on the surface of the polymer electrolyte membrane.

4. The method of claim 1, wherein the step of supporting or depositing catalyst on the surface of the polymer electrolyte membrane having the plurality of nanostructures is performed by a method selected from the group consisting of spray coating, screen coating, tape casting, dual ion-beam assisted deposition and sputter deposition, electrodeposition, electrospray, supercritical deposition using carbon aerogel, platinum sol, and using carbon nanotubes, amorphous super-microporous carbons, or carbon aerogel supports to support platinum or a platinum alloy.

5. A method of forming a nanostructured surface on a polymer electrolyte membrane of a membrane electrode assembly for a fuel cell, the method comprising:

forming a plurality of nano hair structures on a surface of a polymer electrolyte membrane by performing plasma-assisted etching on the surface of the polymer electrolyte membrane placed in a plasma-assisted chemical vapor deposition (PACVD) chamber, wherein the plasma treatment chamber is maintained at a pressure of $1.0 \times 10^{-7}$ to $2.75 \times 10^{-3}$ Pa, at a bias voltage of $-100$V to $-50$ kV for 1 second to 60 minutes during the plasma-assisted etching in the PACVD chamber; and supporting or depositing catalyst on the surface of the polymer electrolyte membrane having the plurality of nanostructures formed by the plasma treatment wherein the nanostructure is a nano-hole structure, having an aspect ratio of 1:50 (width:height).

6. The method of claim 5, wherein the nanostructure is formed by using a gas for plasma treatment selected from the group consisting of argon, $CF_4$, oxygen, $N_2$, and $H_2$.

7. The method of claim 5, further comprising changing an angle formed between the plasma flow direction and the surface of the polymer electrolyte membrane, thus forming a plurality of nanostructures inclined at a specific angle in one direction on the surface of the polymer electrolyte membrane.

8. The method of claim 5, wherein the step of supporting or depositing catalyst on the surface of the polymer electrolyte membrane having the plurality of nanostructures is performed by a method selected from the group consisting of spray coating, screen coating, tape casting, dual ion-beam assisted deposition and sputter deposition, electrodeposition, electrospray, supercritical deposition using carbon aerogel, platinum sol, and using carbon nanotubes, amorphous super-microporous carbons, or carbon aerogel supports to support platinum or a platinum alloy.

9. The method of claim 4, wherein the spray coating is such that platinum or platinum catalyst particles are supported on carbon black and then formed on an ion exchange membrane.

10. The method of claim 4, wherein the dual ion-beam assisted deposition and sputter deposition modifies a surface of the polymer electrolyte membrane and then platinum or a platinum alloy is directly deposited on the surface of the polymer electrolyte membrane by sputtering.

* * * * *